(12) United States Patent
Baumann

(10) Patent No.: US 12,034,319 B2
(45) Date of Patent: Jul. 9, 2024

(54) SERVER-SIDE CHARACTERIZATION OF RECHARGEABLE BATTERIES

(71) Applicant: TWAICE Technologies GmbH, Munich (DE)

(72) Inventor: Michael Baumann, Munich (DE)

(73) Assignee: TWAICE TECHNOLOGIES GMBH, Munich (DE)

( * ) Notice: Subject to any disclaimer, the term of this patent is extended or adjusted under 35 U.S.C. 154(b) by 458 days.

(21) Appl. No.: 17/609,383

(22) PCT Filed: May 7, 2020

(86) PCT No.: PCT/DE2020/100380
§ 371 (c)(1),
(2) Date: Nov. 6, 2021

(87) PCT Pub. No.: WO2020/224724
PCT Pub. Date: Nov. 12, 2020

(65) Prior Publication Data
US 2022/0239122 A1    Jul. 28, 2022

(30) Foreign Application Priority Data
May 8, 2019   (DE) .......................... 102019111979.0

(51) Int. Cl.
*H02J 7/00* (2006.01)
*G01R 31/36* (2020.01)
*G01R 31/367* (2019.01)

(52) U.S. Cl.
CPC ...... *H02J 7/00041* (2020.01); *G01R 31/3648* (2013.01); *G01R 31/367* (2019.01); *H02J 7/0048* (2020.01); *H02J 7/005* (2020.01)

(58) Field of Classification Search
CPC ...... H02J 7/00041; H02J 7/0048; H02J 7/005; G01R 31/3648; G01R 31/367;
(Continued)

(56) References Cited

U.S. PATENT DOCUMENTS 10,985,411 B2 * 4/2021 Sohn ................. H01M 10/48
2015/0268309 A1 9/2015 Kim
(Continued)

FOREIGN PATENT DOCUMENTS

CN 108279383 A 7/2018
EP 3159708 A1 4/2017
(Continued)

OTHER PUBLICATIONS

J. Kim and B. H. Cho, "State-of-Charge Estimation and State-of-Health Prediction of a Li-Ion Degraded Battery Based on an EKF Combined With a Per-Unit System," in IEEE Transactions on Vehicular Technology, vol. 60, No. 9, pp. 4249-4260, Nov. 2011, (Year : 2011).*

(Continued)

*Primary Examiner* — M Baye Diao
(74) *Attorney, Agent, or Firm* — Tucker Ellis LLP

(57) ABSTRACT

A method for server-side characterization of a rechargeable battery (91-96) comprises obtaining operating values for a capacity of the battery (91-96) and an impedance (91-96) of the battery; based on the operating values: performing at least one state prediction (181-183) for the battery (91-96), each of the at least one state predictions (181-183) comprising a plurality of iterations (1099), wherein in each iteration (1099) a simulation of an electrical state of the battery (91-96) and a thermal state of the battery (91-96) is performed and an aging estimate for the capacity and the impedance is determined based on the results, wherein the aging estimate from a first iteration (1099) of the respective state prediction (181-183) is used for the simulation in a subsequent second iteration (1099) of the respective state prediction (181-183).

16 Claims, 9 Drawing Sheets

(58) Field of Classification Search
CPC ..... G01R 31/371; G01R 31/392; B60L 58/26; B60L 58/27; B60L 2240/545; B60L 3/12; B60L 58/16
USPC .......................................................... 320/106
See application file for complete search history.

(56) References Cited

U.S. PATENT DOCUMENTS

| | | | |
|---|---|---|---|
| 2018/0097375 A1* | 4/2018 | Lee | G01R 31/396 |
| 2019/0064282 A1* | 2/2019 | Haga | H01M 10/42 |
| 2020/0164763 A1* | 5/2020 | Holme | B60L 58/16 |

FOREIGN PATENT DOCUMENTS

| | | | | |
|---|---|---|---|---|
| WO | WO-2014179313 A1 * | 11/2014 | | B60L 3/0046 |
| WO | 2017182497 A1 | 10/2017 | | |
| WO | 2019017991 A1 | 1/2019 | | |
| WO | 2019053131 A1 | 3/2019 | | |
| WO | WO-2019053131 A1 * | 3/2019 | | G01R 31/367 |

OTHER PUBLICATIONS

B. Pattipati, C. Sankavaram and K. Pattipati, "System Identification and Estimation Framework for Pivotal Automotive Battery Management System Characteristics," in IEEE Transactions on Systems, Man, and Cybernetics, Part C (Applications and Reviews), vol. 41, No. 6, pp. 869-884, Nov. 2011 (Year: 2011).*
International Search Report from corresponding International Application No. PCT/DE2020/100380, Aug. 4, 2020, 6 pages.
Baumann, Michael, et al., "Cloud-connected battery management for decision making on Second-Life of electric vehicle batteries," 2018 Thirteenth International Conference on Ecological Vehicles and Renewable Energies (EVER), IEEE, Apr. 10, 2018, 6 pages.
Wildfeuer, Leo, et al., "Concept for a hybrid semi-empirical and data-based model for state-of health-monitoring and aging prediction of li-ion battery packs," Jan. 2019, 2 pages.

* cited by examiner

SERVER-SIDE CHARACTERIZATION OF RECHARGEABLE BATTERIES

Various examples of the invention relate to techniques for characterizing a battery. In particular, various examples of the invention relate to techniques for server-side characterization in order to obtain an aging estimate for a prediction interval.

BACKGROUND

Rechargeable batteries, such as traction batteries of electric vehicles, have a limited service life. For example, the so-called state of health (SOH) of batteries may decrease over time, for example as a function of charging cycles. This can be problematic, for example, in connection with the reliable operation of a corresponding battery-powered device. The SOH is typically determined in relation to the capacity and impedance of a battery.

Techniques are known to determine the SOH of the battery in the actual state. For example, such a determination can be made by a battery management system (BMS) of the battery. However, the SOH of the battery in its actual state can only be partially meaningful as to the extent to which the battery can be used reliably in future operation.

BRIEF DESCRIPTION OF THE INVENTION

Therefore, there is a need for improved techniques for characterizing rechargeable batteries. In particular, there is a need for techniques that can provide reliable information about the future operation of the battery.

This object is achieved by the features of the independent patent claims. The features of the dependent patent claims define embodiments.

A method for the server-side characterization of a rechargeable battery comprises obtaining operating values for a capacity of the battery and for an impedance of the battery. In addition, the method comprises performing at least one state prediction for the battery, based on these operating values. Each of the at least one state predictions is associated with a corresponding operating boundary condition of the battery. In addition, each of the at least one state predictions comprises a plurality of iterations. In each iteration, a simulation of an electrical state of the battery and a thermal state of the battery is performed and an aging estimate for the capacity and the impedance is determined based on the results. The aging estimate from a first iteration of the respective state prediction is used for the simulation in a subsequent second iteration of the respective state prediction.

A computer program or a computer program product or a computer-readable storage medium comprises program code. This program code can be loaded and executed by a processor. This causes the processor to perform a server-side characterization of a rechargeable battery, the method comprising obtaining operating values for a capacity of the battery as well as for an impedance of the battery. In addition, the method comprises performing at least one state prediction for the battery, based on these operating values. Each of the at least one state predictions is associated with a corresponding operating boundary condition of the battery. In addition, each of the at least one state predictions comprises a plurality of iterations. In each iteration, a simulation of an electrical state of the battery and a thermal state of the battery is performed and an aging estimate for the capacity and the impedance is determined based on the results. The aging estimate from a first iteration of the respective state prediction is used for the simulation in a subsequent second iteration of the respective state prediction.

A server comprises a processor that is configured to load program code and to execute the above-described method for the server-side characterization of a rechargeable battery based on the program code.

The above-described features, and features which are described below, can be used not only in the relevant combinations explicitly described, but also in other combination or in isolation, without departing from the scope of protection of the present invention.

BRIEF DESCRIPTION OF THE DRAWINGS

FIG. 6 is a flowchart of an exemplary method, wherein FIG. 6 illustrates details related to the simulation of an electrical state and a thermal state of a battery according to various examples.

DETAILED DESCRIPTION OF EMBODIMENTS

Figure 1:
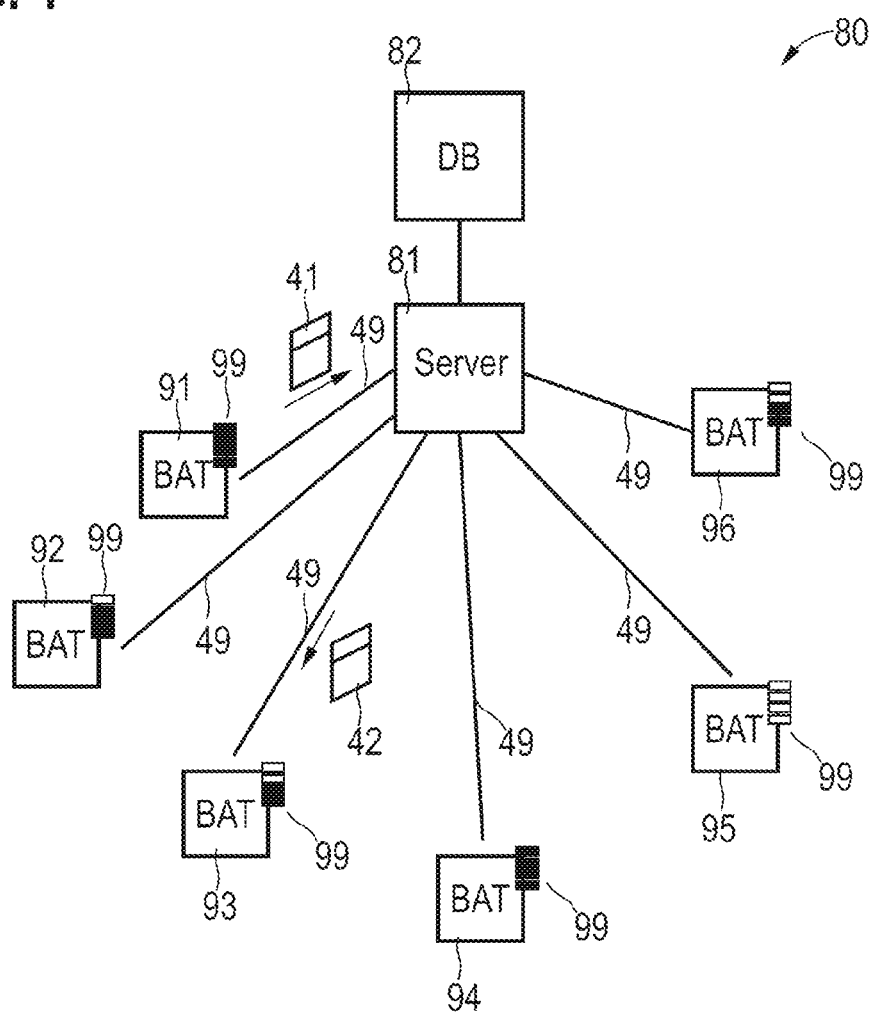
FIG. 1 schematically illustrates a system comprising a plurality of batteries and a server according to various examples.

The properties, features and advantages of the present invention described above and the manner in which these are achieved will become clearer and more comprehensible in conjunction with the following description of the exemplary embodiments, which are explained in more detail in connection with the drawings.

Hereafter, the invention is described in greater detail based on preferred embodiments and with reference to the drawings. In the figures, identical reference signs designate identical or similar elements. The figures are schematic representations of different embodiments of the invention. Elements in the figures shown are not necessarily shown to scale. Rather, the different elements shown in the figures are reproduced in such a way that their function and general purpose are understandable to the person skilled in the art. Connections and couplings between functional units and elements shown in the figures can also be implemented as an indirect connection or coupling. A connection or coupling can be implemented in a wire-bound or wireless manner.

Functional units can be implemented as hardware, software, or a combination of hardware and software.

Techniques related to the characterization of rechargeable batteries are described below. The techniques described herein can be used in connection with a wide range of different battery types, for example in connection with lithium-ion-based batteries, such as lithium-nickel-manganese-cobalt oxide batteries or lithium-manganese-oxide batteries.

The batteries described herein can be used in various applications, for example for batteries used in devices such as motor vehicles or drones or portable electronic devices such as mobile phones. It would also be possible to use the batteries described herein in the form of static energy storage devices.

The techniques described here allow the characterization of the battery to be carried out on the basis of a state prediction of the battery. This means that the state of the battery can be predicted for a certain prediction interval in the future. In particular, an aging estimate of the SOH of the battery can be made for the prediction interval.

As a general rule, the SOH decreases as the aging of the battery increases. Increased aging may occur if the capacitance of the battery decreases and/or if the impedance of the battery increases.

This state prediction can be applied in various ways. For example, the result of a state prediction can be used to adapt the operation of the battery. For example, in this way, excessive aging of the battery could be avoided. Alternatively or additionally, a secondary use of the battery could be determined on the basis of the outcome of the predictive state determination. For example, it could be determined whether the battery is still suitable for a particular application or whether it would have to be withdrawn from circulation. A further application possibility relates to the targeted maintenance and/or repair of batteries depending on the state prediction. For example, it would be possible to maintain or replace etc., such batteries, for which a deteriorated SOH is predicted.

As a general rule, the state prediction techniques described here can be used at different levels: in a simple implementation, the state prediction can be performed at the battery level, i.e., an integral aging estimation can be carried out across all battery blocks and cells of the battery. In further examples, it would also be possible that the state prediction is performed in a resolved way for different battery blocks or even cells of individual battery blocks. Sometimes it may be possible for a battery to be disassembled and individual battery blocks to be discarded while other battery blocks are being reused. In such an example, an individual state prediction at the battery block level can be desirable.

Several of the examples described here can be implemented at least partially on the server side. This means that at least part of the logic associated with the state prediction can be performed on a central server, separate from the battery or battery-powered device. In particular, a communication connection can be established between the server and one or more battery management systems. By implementing at least part of the logic on the server, particularly accurate and computationally intensive models and/or simulations can be used in connection with the state prediction. This allows the state prediction to be performed particularly accurately. In addition, it may be possible to collect and use data for an ensemble of batteries, for example in connection with machine-learning models.

Various examples described here can perform the state prediction while the battery is in use on the basis of measurement data from the battery. This means that the state prediction is carried out in particular for a specific time during the life of the battery—with a reduced SOH. The battery can then be used in the field. In this way, it may be possible in particular to take into account the aging behavior of the battery. This also makes it possible to perform the predictive state determination particularly precisely.

FIG. 1 illustrates aspects related to a system 80. The system 80 comprises a server 81 connected to a database 82. The system 80 additionally includes communication connections 49 between the server 81 and each of a plurality of batteries 91-96. Communication connections 49 could be implemented over a mobile network.

FIG. 1 illustrates by way of example that the batteries 91-96 can send state data 41 to the server 81 via the communication connections 49. For example, it would be possible for the state data 41 to be indicative of one or more operating values of the respective battery 91-96. The state data 41 could be sent in an event-driven manner or according to a specified timing scheme.

As a general rule, operating values can be indicative of the actual value of the SOH of the respective battery 91-96. For example, the operating values can be indicative of the capacity of the respective battery 91-96. Alternatively or additionally, the operating values can also be indicative of the actual value of the impedance of the respective battery 91-96. Alternatively or additionally, it would be possible that the operating values are indicative of an operating profile of the respective battery 91-96. For example, an event-related operating profile and/or a collective operating profile could be indicated by the operating values.

FIG. 1 also illustrates by way of example that the server 81 can send control data 42 to the batteries 91-96 via the communication connections 49. For example, the control data 42 could indicate one or more operating limits for the future operation of the respective battery 91-96. For example, it would be possible to determine these operating limits based on a human-machine display. For example, the control data could indicate one or more control parameters for a thermal management of the respective battery 91-96 (i.e., a selection of the cooling capacity) and/or a charge management of the respective battery 91-96 (i.e., a limitation of the charging current). Using the control data 42, the server 81 can thus influence or control the operation of the batteries 91-96.

In FIG. 1 the respective SOH 99 is also schematically illustrated for each of the batteries 91-96. As a general rule, the SOH 99 of a battery 91-96 can contain one or more different characteristics depending on the implementation. Typical parameters of the SOH 99 can be, for example, electrical capacity, i.e. the maximum possible stored charge; and/or electrical impedance, i.e. the frequency response of the resistance or AC resistance as the ratio between electrical voltage and electrical current.

The following describes state prediction techniques that allow the SOH 99 to be predicted for each of the batteries 91-96 for a prediction interval while the batteries 91-96 are in use. This means that, for example, the electrical impedance and/or the electrical capacity can be predicted.

Figure 2:
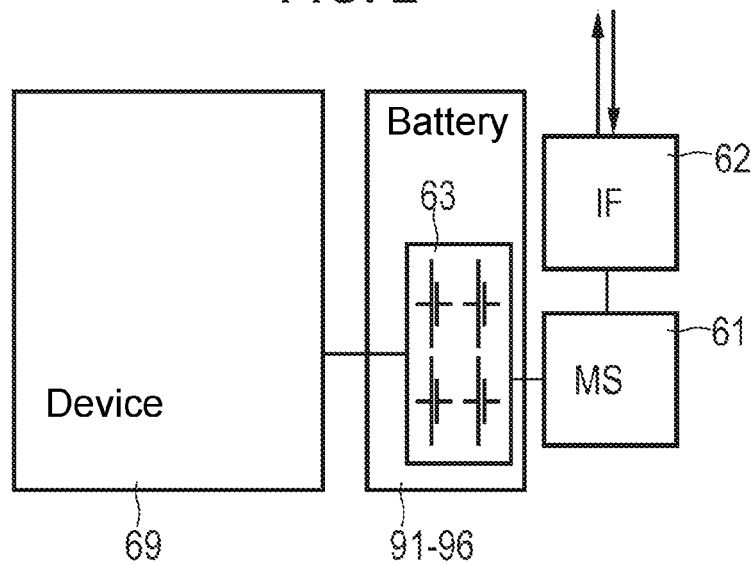
FIG. 2 illustrates details of a battery according to various examples.

FIG. 2 illustrates aspects related to the batteries 91-96. The batteries 91-96 are connected to a respective device 69. This device is powered by electrical energy from the respective battery 91-96.

The batteries 91-96 comprise or are associated with one or more management systems 61, e.g. a BMS or other control logic such as an on-board unit in the case of a vehicle. For example, the management system 61 can be implemented by software on a CPU. Alternatively or additionally, an application-specific circuit (ASIC) or a field programmable gated array (FPGA) could be used. The batteries 91-96 could communicate with the management system 61, for example, via a bus system. The batteries 91-96 also include a communication interface 62. The management system 61 can establish a communication connection 49 with the server 81 via the communication interface 62.

While in FIG. 2 the management system 61 is drawn separately from the batteries 91-96, in other examples it would also be possible that the management system 61 is part of the batteries 91-96.

In addition, the batteries 91-96 comprise one or more battery blocks 63. Each battery block 63 typically comprises a number of parallel and/or serial-connected battery cells. Electrical energy can thus be stored there.

Typically, the management system 61 can rely on one or more sensors in one or more battery blocks 63. For example, the sensors can measure the current flow and/or voltage in at least some of the battery cells. The sensors can alternatively or additionally measure other variables in connection with at least some of the battery cells, e.g. temperature, volume, pressure, etc. The management system 61 can then be set up, to determine a current SOH 99 for the respective battery 91-96, or optionally for individual battery blocks based on one or more such measured values from sensors, i.e., for example, determining the electrical capacity and/or impedance of the battery and sending it to the server 81 in the form of operating data. The management system 61 can also be configured to implement a thermal management and/or a charge management of the respective battery 91-96. In connection with the thermal management, the management system 61 could, for example, control cooling and/or heating. In the context of charge management, the management system 61 could, for example, control a charging rate or a depth of discharge. The management system 61 can therefore set one or more operating boundary conditions of the respective battery 91-96.

Figure 3:
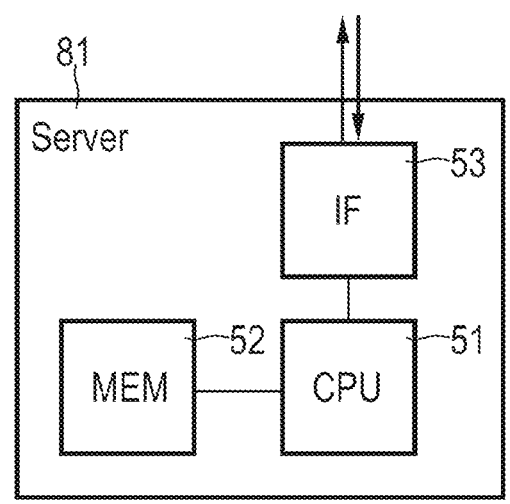
FIG. 3 illustrates details of a server according to various examples.

FIG. 3 illustrates aspects related to the server 81. The server 81 comprises a processor 51 and a memory 52. The memory 52 can comprise a volatile storage element and/or a non-volatile storage element. In addition, the server 81 also comprises a communication interface 53. Via the communication interface 53, the processor 51 can establish a communication connection 49 to each of the batteries 91-96 as well as the database 82. The server 81 could additionally have an interface to communicate with a user, for example, for example, also with a user of one of the batteries 91-96. This means that the server 81 can be configured for human-machine interaction.

For example, program code can be stored in the memory 52 and loaded by the processor 51. The processor 51 can then execute the program code. Executing the code causes the processor 51 to carry out one or more of the following processes, as described in detail in the various examples in this document: characterizing batteries 91-96; performing one or more state predictions for one or more of the batteries 91-96, for example based on operating values received as state data 40 from the corresponding batteries 91-96 via the communication link; performing an electrical simulation of the batteries 91-96; performing a thermal simulation of the batteries 91-96; performing an aging estimation of the batteries based on one or more operating profiles; sending control data to the batteries 91-96, for example, in order to set operating boundary conditions; storing a result of a characterization of a corresponding battery 91-96 in a database 82; performing a human-machine interaction based on a result of the characterization of a corresponding battery 91-96, e.g. for selecting operating limits for an operating profile, etc.

Figure 4:
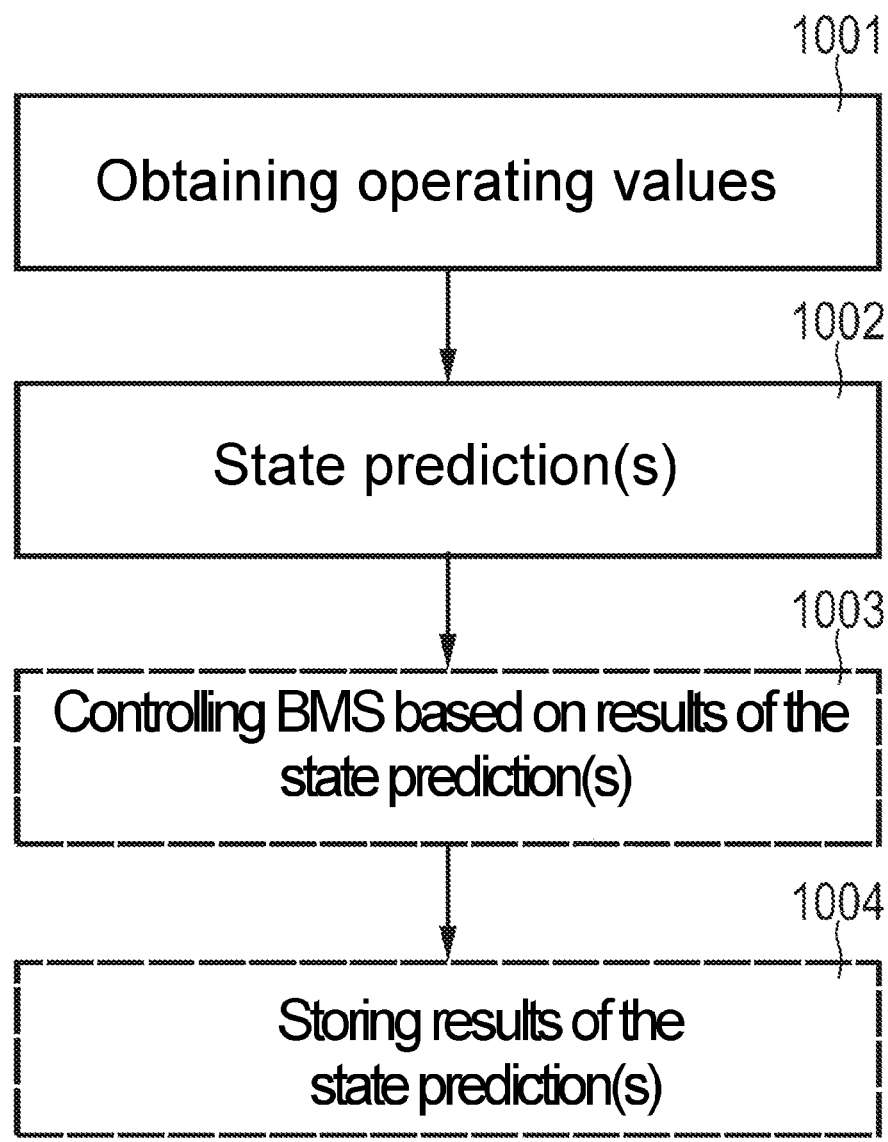
FIG. 4 schematically illustrates a flowchart of an exemplary method.

FIG. 4 schematically illustrates a flowchart of an exemplary method. The method is executed by a server. The method is used for the server-side characterization of a battery. For example, it would be possible that the method according to FIG. 4 is carried out by the processor 51 of the server 81, based on program code from the memory 52 (see FIG. 3). Optional blocks are represented in FIG. 4 with dashed lines.

Firstly, in block 1001, one or more operating values are obtained from the battery to be characterized. In block 1001, for example, state data can be received via a communication connection between the battery and the server.

The one or more operating values can relate, for example, to a SOH of the battery. The one or more operating values can affect, for example, a battery capacity and/or an impedance of the battery. In general, it would also be possible for one or more other characteristic variables of the operation of the battery to be indicated by one or more operating values. For example, in some examples, current data (for example, a time series) and/or voltage data (for example, a time series) may be indicated by the operating values. This means that the operating values could, for example, describe a time curve of the current in one or more cells of a battery block of the battery, or a time curve of the electrical voltages of one or more cells of a battery block of the battery.

For example, the operating values could also describe a temperature in one or more areas of a battery. The operating values could, for example, describe a corresponding time series of temperature data. Alternatively or additionally, it would be possible for the operating values to indicate one or more operating profiles of the batteries for a monitoring interval.

As a general rule, an operating profile could describe, for example, one or more of the following characteristic variables for the operation of the battery: depth of discharge used; mean depth of discharge; rate of charge used; rate of discharge used; typical temperature during operation; frequency of charging operations; frequency of discharging operations; the time period between two charging operations; the time period between two discharging operations; etc. Event-related operating profiles and/or collective operating profiles can be used.

Subsequently, in block 1002, one or more state predictions are performed for the battery in order to characterize it.

If a plurality of state predictions is performed in block 1002, these can be associated with different boundary conditions of battery operation. For example, the operating boundary conditions taken into account in block 1002 could affect one or more of the following: a control parameter of a thermal management of the battery and/or a control parameter of a charge management of the battery. In general, the operating boundary conditions may determine certain conditions for the operation of the battery, which are separate from the specific operating profile, which is determined, for example, by the use of the respective device 69 associated with the corresponding battery (i.e., for example, the load, the extracted charge, the discharging rate, the charging rate, the depth of discharge, etc.).

The one or more state predictions in block 1002 can be based on an operating profile which is derived from an operating profile that is indicated by the operating values from block 1001 for the respective battery during a monitoring interval. For example, it would be possible to determine the operating profile used for one or more state predictions in block 1002 based on measurements taken at the battery during the monitoring interval. This means that, for example, the measured DOD and/or measured SOC cycles and/or measured load rates etc. can be used in conjunction with one or more state predictions in block 1002. By using an operating profile for one or more state predictions in block 1002, which is geared towards the specific operation of the corresponding battery during the monitoring interval, a particularly reliable or precise state prediction can be made possible.

The state prediction can result in the production of a time curve of the aging for a prediction interval. This is illustrated in FIG. 5.

Figure 5:
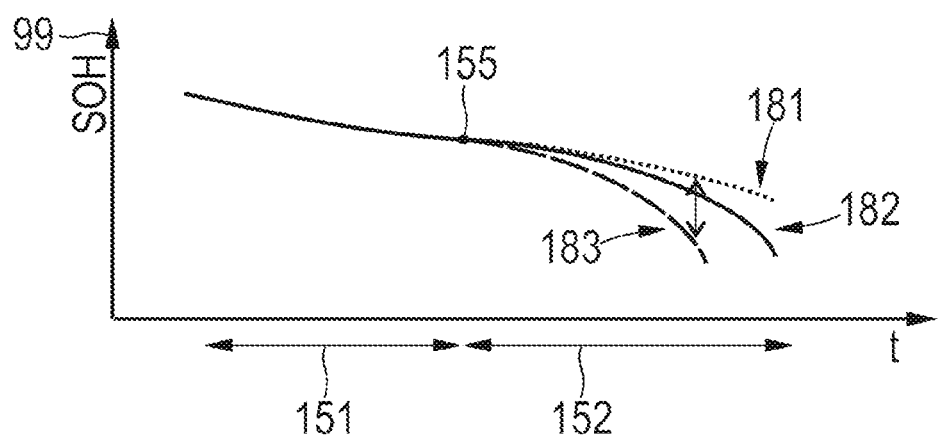
FIG. 5 schematically illustrates the result of aging estimates for a plurality of state predictions for characterizing a battery according to various examples.

FIG. 5 illustrates aspects related to the aging of a battery, such as one of the batteries 91-96 from FIG. 1. In FIG. 5, the SOH 99 is represented as a function of time. During a monitoring interval 151, the SOH 99 decreases. For example, this decrease in the SOH 99 could be measured by referring back to operating values for the capacity and impedance of the respective battery from the appropriate management system (see FIG. 2, where a management system 61 is shown).

Then, at time 155, a characterization of the battery is carried out by performing a plurality of state predictions 181-183 for the battery. The state predictions 181-183 provide a prediction of battery aging, i.e. the SOH 99 during a prediction interval 152. From FIG. 5 it is apparent that the SOH 99 varies between the different state predictions 181-183, due to the different operating boundary conditions used. The operating boundary conditions may differ in terms of temperature, open-circuit charge state, charging and discharging rate, charging and discharging end point, cycle depth and/or mean charge state during charging and discharging, as well as combinations thereof. For example, it would be possible that the state prediction 181—which results in a comparatively small decrease of the SOH 99 as a function of time during the prediction interval 152—suggests a different thermal management configuration compared to the state prediction 183—which results in a comparatively large decrease of the SOH 99 as a function of time during the prediction interval 152. For example, thermal management of the battery could allow for lower operating temperatures with active cooling as the operating boundary condition for the state prediction 181.

While an example is described above, in which the state predictions 181-183 are associated with different operating boundary conditions, alternatively or additionally, in other examples it would be possible to vary the operating profile for the plurality of state predictions. For example, different state predictions may be associated with different DODs and/or different maximum SOCs and/or different charging rates, etc. This means that the strategy for the operation of the battery can be changed.

Now referring to FIG. 4 once again: as a general rule, the results of one or more state predictions 181-183 from block 1002 can be used in different ways.

In an example, it would be possible for a management system associated with the respective battery to be controlled based on the results of one or more state predictions from block 1002 (see block 1003). In this context, it would be possible, for example, to perform a plurality of state predictions of block 1002 and to compare the corresponding results of the plurality of state predictions. The management system could then be controlled based on a comparison of the results. This could be done, for example, by taking into account a human-machine interaction carried out on the basis of the results. For example, it would be possible for control data (see FIG. 1: control data 42) to be determined based on the comparison of the results and this control data to be sent to the management system. As a general rule, one or more different parameters for the operation of the respective battery can be set. For example, it would be possible for the control data to specify one or more operating limits for the future operation of the battery. Alternatively or in addition, it would be possible for the control data to specify one or more control parameters for a thermal management and/or a charge management of the battery. By means of such a feedback of the results of one or more state predictions or the general characterization of the battery, it may be possible to enable a particularly sustainable operation of the respective battery.

Some examples are explained further below. For example, operating limits for the future operation of the respective battery could be set in such a way that the battery only ages comparatively slowly, i.e., that the SOH 99 only decreases slowly as a function of time. For example, it would be conceivable that a result of the characterization is output to the user of the respective battery, via a suitable human-machine interface. This could be done, for example, via a web page, on which the state predictions for different operating profiles of the battery are displayed. A mobile app would be conceivable. A push notification could be sent when the result of the characterization is available. Then the user could select one of the battery profiles and then the future operation of the respective battery can be adjusted accordingly to implement the selected operating profile by means of operating boundary conditions. Therefore, the user can take a decision on how to charge the battery in the future, taking into account both the expected aging and the limitation of the operation of the battery due to the selection of a specific operating profile.

For example, if the state predictions identify certain operating boundary conditions of the battery which result in a particularly severe aging of the battery, they could be excluded from the future operation of the battery by means of an appropriate definition of the operating limits. In this way, for example, manufacturing errors etc. of the battery can be compensated for by the appropriate control of the operation. It would be possible, for example, that the various state predictions are associated with different operating boundary conditions, i.e., other operating parameters for a thermal management or a charging management (e.g. charging current). Then, by comparing the aging with the selection of different operating boundary conditions, it is possible to determine how the operating limits should be selected in relation to the operating boundary conditions in order to prevent excessive aging. Such a selection can be made, for example, by the user, for example via a front-end access to the server or another human-machine interface. For example, the user could specify the maximum charging current, while at the same time the effect of this selection on the aging is fed back to the user based on the characterization described herein.

In another example, if the state predictions identify certain operating profiles of the battery which result in a particularly severe aging of the battery, they could be excluded from the future operation of the battery by means of an appropriate definition of the operating limits. It would be possible, for example, that the various state predictions are associated with different operating profiles. Then, by comparing the aging with the selection of different operating boundary conditions, it is possible to determine how the operating limits related to the operating profile should be chosen in order to prevent excessive aging. The following is a description of a specific example. For example, a micro-grid with static energy storage could be provided as a rechargeable and solar system. The micro-grid can have a connection to a mains power grid and operate so-called peak shaving, i.e., cushion load peaks of the main power grid (typically in the evening hours) by supplying energy to the main power grid. However, the batteries of the static energy storage system are charged at midday, because at that time the energy generated by the solar system is particularly strong. The operating profile can indicate a charging rate and a discharging rate of the batteries. The operating profile can then be adapted depending on the state predictions. This means that different operating strategies can be determined for the micro-grid. In another example, a state prediction for different charging strategies could be made for a battery-powered product in mobile applications, e.g. an electric car or bus. Based on this, the charge management and/or thermal management of the batteries could be adjusted before or during charging to prevent excessive aging.

As a general rule, it would be possible to consider one or more predefined enabled ranges for future battery operation when determining the control data. This means that, although one or more specific operating ranges are identified as being particularly harmful to the aging of the battery in connection with the state prediction, the operation of the batteries cannot be restricted to the corresponding operating ranges due to predefined preferences. These enabled ranges may affect operating boundary conditions and/or the operating profile. For example, depending on the type of battery-powered device, it can be ensured that no restriction of functionality results.

However, it is not necessary in all examples that the results of one or more state predictions be fed back into the operation of the battery. In this respect, block 1003 is an optional block.

In some examples, it would be possible, alternatively or in addition, for results of the state predictions to be stored in a database (see FIG. 1: database 82), see block 1004. For example, this storage would enable the aging state of the battery to be determined particularly quickly by subsequently comparing the actual operating profile during the prediction interval 152 with the stored results of the one or more state predictions. For example, a second use of the battery could be specifically selected, depending on whether the SOH 99 still permits a corresponding use of the battery. In addition, training of machine-learning models for the aging estimate could be carried out.

In some examples, it would be possible, alternatively or additionally, that results of the state predictions are output to a user, for example via a suitable human-machine interface. For example, the user could intervene appropriately in the operation of the battery in order to avoid excessive aging in light of the state predictions. Operating boundary conditions can be set by the user.

Performing one or more state predictions in block 1002 can require a comparatively large amount of computing resources. This means that the corresponding server, which is typically responsible for characterizing a plurality of batteries, could selectively trigger one or more state predictions to be performed depending on one or more trigger criteria (at time 155, cf. FIG. 5): this can avoid a new state prediction being constantly performed. Instead, one or more state predictions can be carried out on a demand-oriented basis. For example, it would be possible for the server to repeatedly obtain the (e.g. collective or event-related) operating profile of the battery for the monitoring interval 151, from the corresponding management system associated with the battery. Then the server can monitor the development of the operating profile as a function of time. This may mean that the server will check for changes to the operating profile between two times. Depending on such monitoring, it is then possible to selectively trigger the at least one state prediction to be performed. If, for example, one or more characteristics of the operating profile change, then the state prediction could be triggered: this is based on the recognition that in such a situation it can be particularly likely that there is a significant influence on the aging state of the battery due to the changed state profile.

However, in another, simple implementation it would also be possible that the one or more state predictions in block 1002 is performed according to a given schedule, for example at a certain repetition rate, etc.

Figure 6:
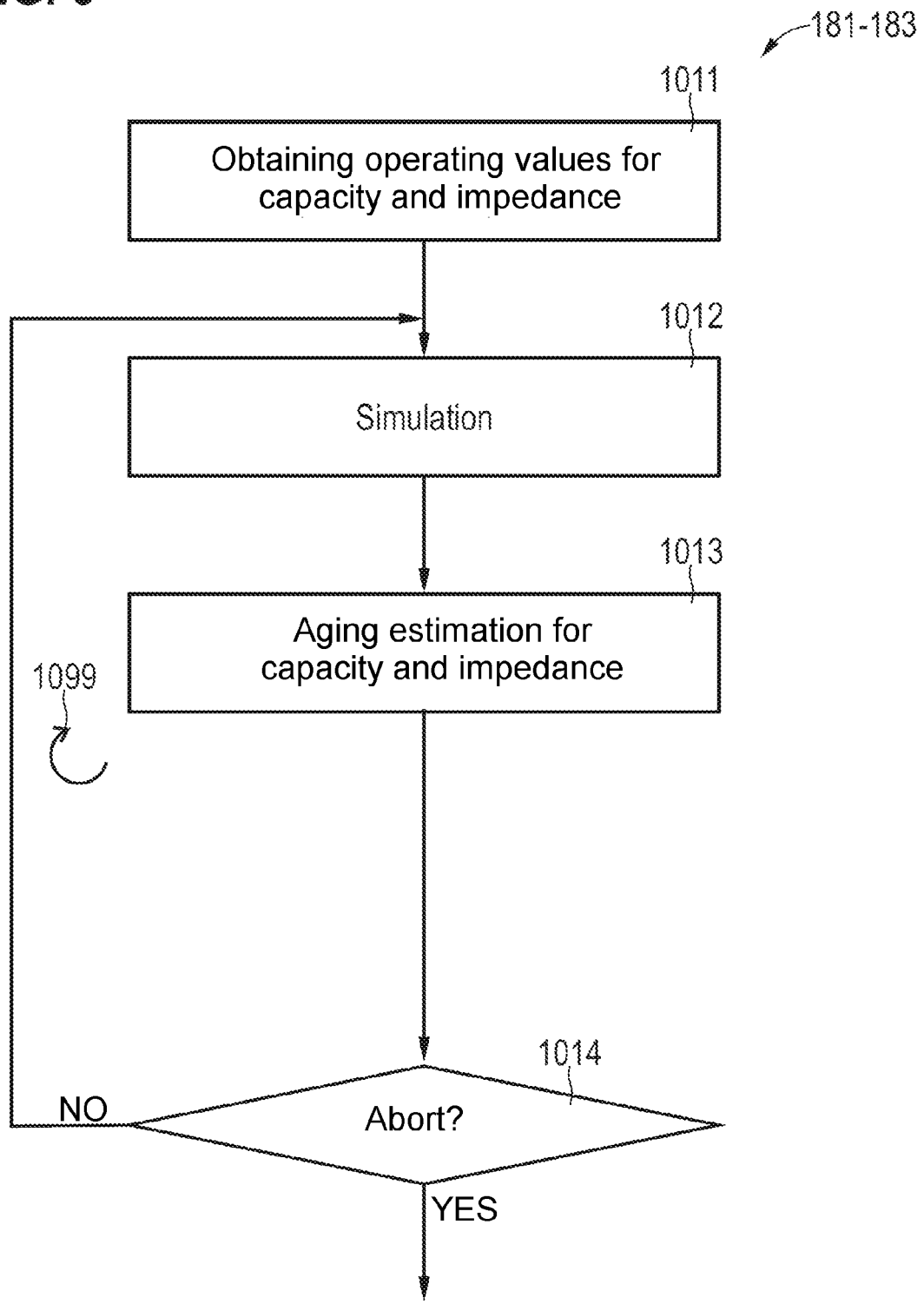

Next, an example implementation of performing the one or more state predictions in block 1002 is described in conjunction with the flow chart in FIG. 6.

FIG. 6 illustrates a flowchart of an exemplary method. The method according to FIG. 6 can be executed from a server. For example, it would be possible that the method according to FIG. 6 is executed by the processor 51 of the server 81, based on program code from the memory 52 (see FIG. 3).

The method according to FIG. 6 is used to predict the state of health of a battery. If multiple state predictions are to be performed, the method in FIG. 6 is performed multiple times.

In block 1011, the operating values for the capacity and the impedance of the respective battery are obtained first. Block 1011 thus corresponds to block 1001. This means that a current value for the SOH 99 of the battery is obtained. This is typically carried out based on state data received from the respective management system associated with the corresponding battery. These operating values are used to initialize the state prediction.

Then a plurality of iterations 1099 of blocks 1012-1014 is performed. The different iterations 1099 correspond to time steps for the state prediction, i.e., advancing time during the prediction interval 152.

In block 1012, the simulation of an electrical state of the battery and a thermal state of the battery is carried out first by means of corresponding simulation modules for the respective time step of the corresponding iteration 1099.

In block 1012, the simulation takes place taking account of a corresponding operating boundary condition of the battery. This depends on the respective state prediction 181-183. In addition, an appropriate operating profile for the operation of the battery can be assumed.

An electrical simulation module can be coupled with a thermal simulation module to simulate the electrical and thermal state.

The electric simulation module can use an equivalent circuit model (ECM) for the battery. The ECM can include electrical components (resistance, inductance, capacitance). The parameters of the components of the ECM can be determined, for example, by means of a Nyquist plot with the characteristic frequency ranges of the transfer function of the cell block of the battery. Due to the implementation on the server 81, the number of RC elements can be chosen to be particularly large, e.g. greater than three or four. This enables a particularly high accuracy of the electrical simulation to be achieved. One ECM can be used for each cell of a cell block.

The thermal simulation model enables the time-temperature curve and optionally the local temperature to be determined. Heat sources and heat sinks can be taken into account. The heat dissipation to the environment can be taken into account. Details of the heat generation model are described, for example, in: D. Bernandi, E. Pawlikowski, and J. Newman, "A General Energy Balance for Battery Systems," Journal of the Electrochemical Society, 1985. Analytical or numerical models for the local temperature distribution can be used. The influence of a thermal management system can be taken into account. See e.g., M.-S. Wu, K. H. Liu, Y.-Y. Wang, and C.-C. Wan, "Heat dissipation design for lithium-ion batteries," Journal of Power Sources, vol. 109, No. 1, pp. 160-166, 2002.

Based on this, an aging estimate is then performed in block 1013, i.e. the capacity and impedance of the battery are determined for the respective time step based on a result of the simulation of the electrical state and of the thermal state of the battery.

Different techniques can be used in connection with the aging estimate. The aging estimate can comprise, for example, an empirical aging model and/or a machine-learning aging model. For example, an empirical aging model and a machine-learning aging model could be applied in parallel and then results of these two aging models could be combined by averaging, for example, weighted averaging.

As a general rule, the empirical aging model could comprise one or more empirically determined parameters that relate an operating profile of the battery obtained from the simulation from block 1012 to a deterioration of the SOH 99, for example a reduction of the capacity and/or an increase in the impedance. The parameters can be determined in laboratory tests, for example. An example empirical aging model is described in: J. Schmalstieg, S. Käbitz, M. Ecker, and D. U. Sauer, "A holistic aging model for Li(NiMnCo)O2 based 18650 lithium-ion batteries," *Journal of Power Sources*, Vol. 257, pp. 325-334, 2014.

In contrast, a machine-learning aging model can be continuously adapted based on state data obtained from different batteries of the same type, using machine learning. For example, artificial neural networks, such as convolutional neural networks, could be used. Another technique comprises the so-called support vector machine method. For example, data from an ensemble of batteries (see FIG. 1: Batteries 91-96) can be used to train a corresponding algorithm using machine learning.

Figure 7:
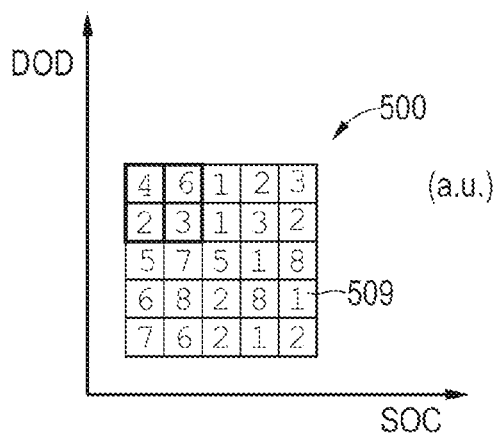
FIG. 7 schematically illustrates a collective operating profile of a battery according to various examples.

Different aging models can receive different inputs from the simulation in block 1012. For example, in a variant it would be possible for one or more simulated collective operating profiles (sometimes also called load collective) for the battery to be determined based on the simulated electrical states and/or simulated thermal states determined in a plurality of iterations 1099. Such collective operating profiles may indicate the frequency of battery operation at specific operating points. This means that a collective load profile comparable to a histogram quantifies the frequency of the occurrence of the battery operation at a specific operating point, but does not indicate a sequence of the battery operation at the operating points or a specific time at which the battery is operated at a specific operating point. FIG. 7 illustrates an exemplary simulated collective operating profile 500. The graph indicates the respective frequency 509 of operation of the battery (in arbitrary units) for different operating points defined in the two dimensions of depth of discharge (DOD) and state of charge (SOC). The SOC indicates the status of the current charge as a percentage of the capacity of the battery. The two dimensions DOD-SOC used here are only examples. Alternative dimensions that can be considered in connection with collective operating profiles for the aging estimation include, for example: charging rate; temperature during charging; temperature during discharging; discharging rate; etc. It would also be possible to compile collective operating profiles with more than two dimensions, e.g. with three or four dimensions.

The frequency can be indicated, for example, chronologically or in terms of cycles. Various counting methods can be used for this, e.g. peak value counting, limit violation counting, instantaneous value counting, range counting, range-pair mean counting, rainflow counting (e.g. DE102009006461A1), etc.

For example, in FIG. 7 highlighting is used to illustrate that particularly strong aging of the battery occurs for large discharge depths at low charge states.

In a further variant—alternatively or in addition to the one or more simulated collective operating profiles—one or more simulated event-related operating profiles could also be considered in connection with one or more aging models used. An example event-related operating profile 510 is illustrated in connection with FIG. 8. This shows the time curve of the charging rate, the voltage between the terminals of the battery, and the temperature in connection with the event of a charging of the corresponding battery. In addition, the corresponding mean values 511 are illustrated.

Figure 8:
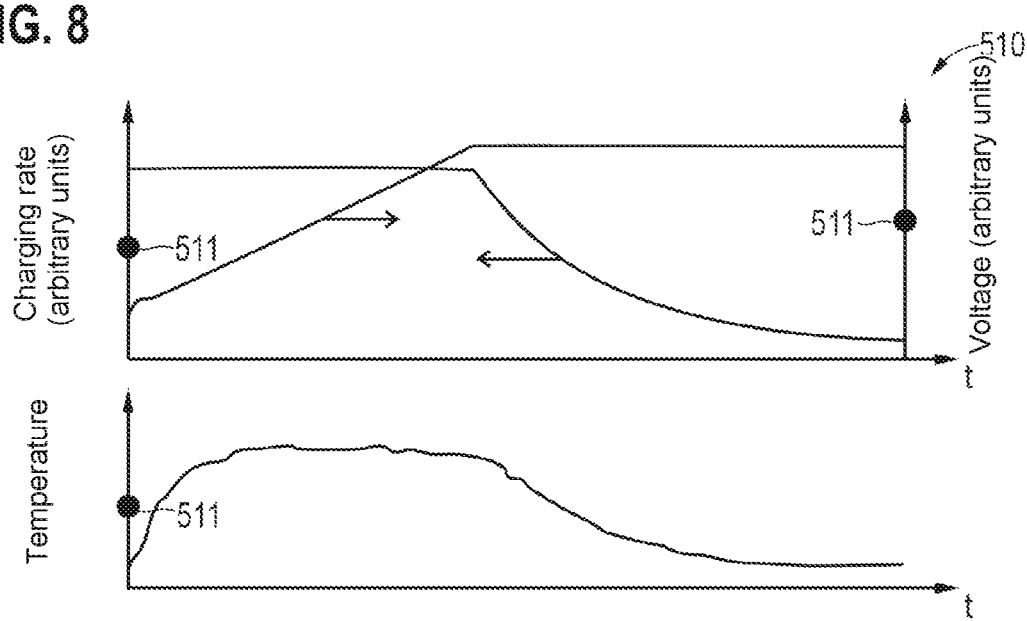
FIG. 8 schematically illustrates an event-related operating profile of a battery according to various examples.

In some examples, it would be conceivable to take into account the time curves of one or more variables that characterize the event (thus in FIG. 8 the charging rate, the voltage and the temperature) directly in conjunction with the aging model; however, it would also be conceivable to take derived variables into account (as in the example of FIG. 8, the mean values 511). In either case, the example of FIG. 8 also shows that one or more variables of an event-based operating profile are not related to the frequency of the corresponding operating point but are related to the individual event.

It is possible that the aging estimate comprises a plurality of components, for example, a first model component that receives one or more simulated collective operating profiles as input, and a second model component that receives one or more simulated event-related operating profiles as input. It is then possible, by taking into account such different operating profiles, to form the aging estimate particularly accurately. For example, in this context, it would be possible for the various components of the aging estimate to be carried out separately first, and then the results of the various components of the aging estimate to be combined with each other in order to obtain a result of the aging estimate.

Referring again to FIG. 6: then, in block 1014, a check is made as to whether an abort criterion is met. If this is not the case, block 1012 is executed again for the next time step in the prediction interval 152, i.e. for the next iteration 1099. The capacities and impedances determined in the previous iteration 1099 are used here, i.e. the simulations in block 1012 build on one another. This iterative adaptation of capacity and impedance allows a particularly accurate state prediction.

If the abort criterion in block 1014 is met, the state prediction is complete. Examples of abort criteria include: number of iterations 1099; end of the prediction interval 152 reached; exceeding or undershooting of capacity and/or impedance thresholds; etc.

In many examples, it can be desirable for the initial operating value for the impedance and capacity in block 1011 to be available with a particularly high accuracy. In connection with FIG. 9 as an example technique is described that facilitates this.

Figure 9:
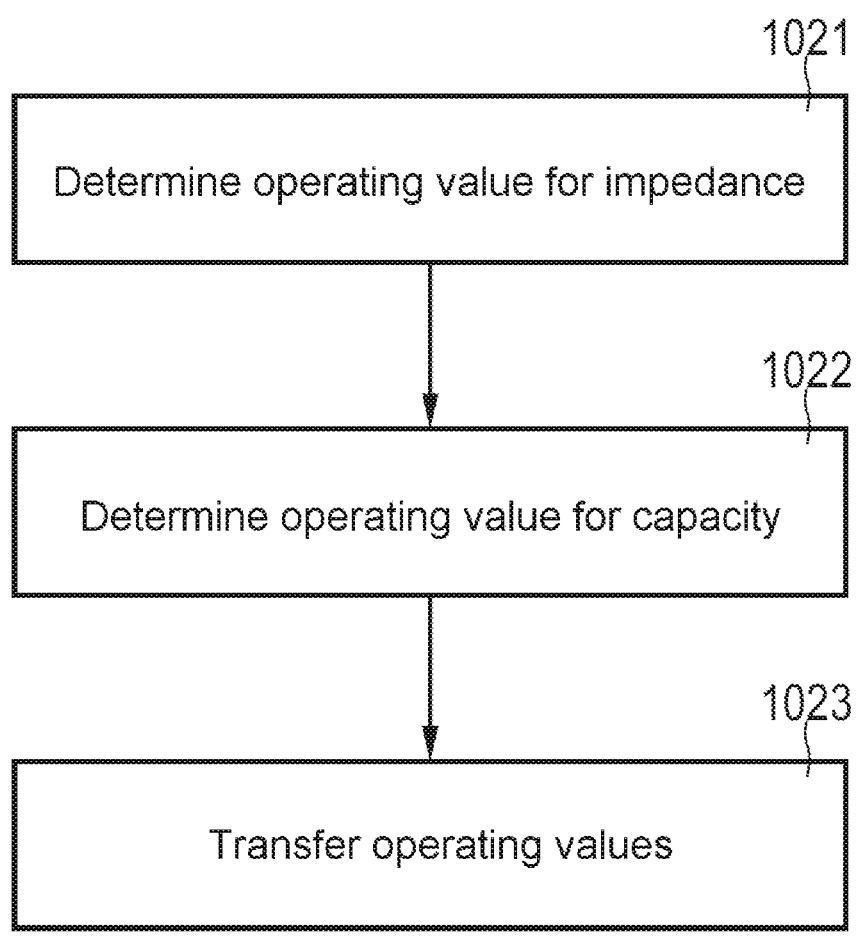
FIG. 9 schematically illustrates a method for determining operating values for an impedance and a capacity of the battery according to various examples.

FIG. 9 illustrates a flowchart of an exemplary method. For example, the method of FIG. 9 can be carried out on the device, on a management system associated with a battery. For example, it would be possible for the method according to FIG. 9 to be carried out on the management system 61 according to FIG. 2. However, it would also be possible for the method of FIG. 9 to be carried out on the server.

The method according to FIG. 9 enables the capacity and impedance to be determined with particular accuracy, based on measurement data. Corresponding actual values can be determined in the field during normal operation.

First, an operating value for the impedance is determined in block 1021. This could be carried out using an ECM, for example. The operating value for the impedance can be determined, for example, by determining the parameters of one or more components of the ECM. This means that, for example, a resistance of an R-element of the ECM can be determined, or an inductance of an L-element or a capacitance of a C-element. For example, it would be possible to determine the operating value based on time series for the current flow and/or the electrical voltage.

An operational value for the capacity is then determined in block 1022. This can be achieved, for example, on the basis of open-circuit voltages, as described in, for example: M. Einhorn, F. V. Conte, C. Ral, and J. Fleig, "A Method for Online Capacity Estimation of Lithium Ion Battery Cells Using the State of Charge and the Transferred Charge", IEEE Trans. on Ind. Applicat, Vol. 48, No. 2, pp. 736-741, 2012.

The operating values determined in blocks 1021-1022 are then transmitted to a server, for example via a corresponding communication interface, in the form of state data (see FIG. 1: State data 41). In this respect, block 1023 corresponds to block 1001 or 1011.

Figure 10:
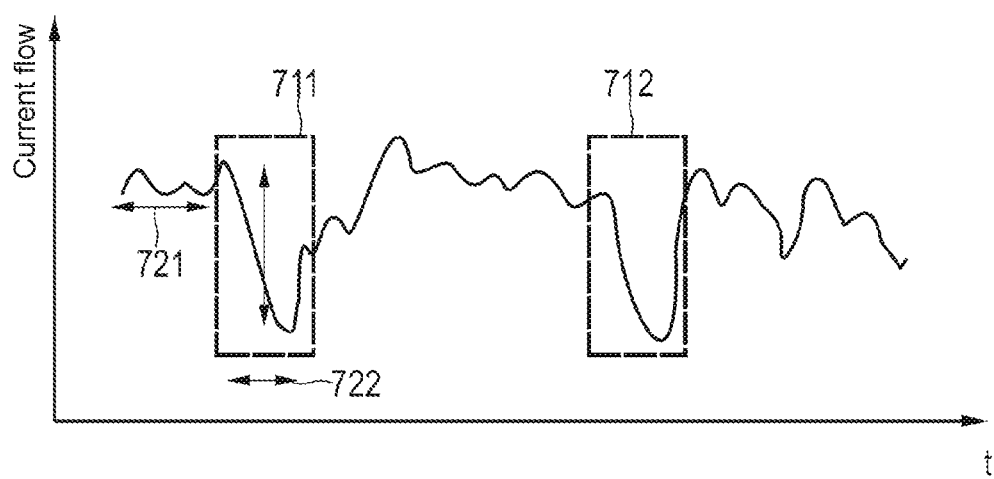
FIG. 10 schematically illustrates a current time series with jump windows for determining an operating value for the impedance of the battery according to various examples.

FIG. 10 illustrates aspects related to determining an operating value for the impedance of a battery, e.g. according to block 1021 of FIG. 9. The corresponding techniques as they relate to the example illustrated in FIG. 10, for example, can be executed on a local management system associated with a battery (for example, on the management system 61 according to FIG. 2). A result of the corresponding evaluation could then be transferred to a server 81, for example, in the form of the state data 41. This means that the operating value for the impedance can be determined on the device side at the battery. However, it would also be possible to perform the corresponding determination on the server side.

FIG. 10 shows a time series of measurements for the current flow in one or more cells of the battery. Based on the time curve of the current flow (or alternatively or additionally on the time curve of the voltage and/or other characteristic parameters of the electrical operation of the battery), it is possible to determine the operating value for the impedance of the battery. One or more characteristic parameters of the thermal operation could also be taken into account.

According to various examples, this is achieved by extracting values from the time series of current flow and/or voltage, in the example of FIG. 10 within the jump windows 711, 712. Then one or more analysis algorithms can be applied to the extracted values for each jump window. For example, one or more analysis algorithms could be applied to the values in the jump window 711, and the one or more analysis algorithms could then also be applied to the values in the jump window 712. By extracting the values from the continuous time series, it is possible to enable real-time processing by reducing the data volume. The one or more analysis algorithms can operate on the values extracted for a given jump window 711, 712 sequentially and/or in parallel. For the different jump windows 711, 712, candidate values for the impedance can then be obtained, which can then be combined to obtain the corresponding operating value.

Such techniques are based on the recognition that it is often possible to extract time curves of current and/or voltage particularly relevant to the impedance from the continuous time series of the corresponding data.

In particular, it would be possible for one or more jump windows 711, 712 to be determined in such a way that they contain relevant data. In general, one or more jump windows 711, 712 can be determined based on an analysis of the time series of the current data and/or voltage data with respect to one or more criteria. For example, the criteria could be selected from the following group: duration 722 of a discharge operation; charge quantity of the discharge operation; rest phase 721 before the discharge operation; or one or more of these parameters in conjunction with a charge operation (instead of a discharge operation).

Such techniques are based on the recognition that instead of defined relaxation times and pulsed loads as used in laboratory parameterization, in the vehicle application a highly fluctuating and undefined current excitation can often be present in the field. In order to allow meaningful parameter values still to be determined for the ECM in connection with the determination of the operating value of the impedance, the jump windows 711, 712 described above are selected in the window search process. The starting point for this is a ring buffer of defined length, for example. This buffer stores current and voltage measurements of the BMS unfiltered at the sampling rate according to the first-in-first-out principle (FiFo). In each time step, the entire ring buffer is compared with a set of predefined prototype windows which define the criteria. If a section meets the criteria of a prototype window, the measured values are extracted for further analysis.

Examples of relevant criteria include: for the parameter determination, the initial values of the RC elements must be known. If a constant current is present for a sufficiently long period of time 721, the corresponding resistance of the ECM can be determined. The start of a jump window 711, 712 should therefore be defined after a time interval 721 with as constant a current as possible. The second criterion for the jump window selection relates to the dynamics of the current and voltage signal in the jump window 711, 712 itself. It can be noted that the dynamic effect to be represented (e.g. diffusion) is also sufficiently excited by the current load. If, for example, at the beginning of a journey when the battery cells are relaxed a window with too low a charge throughput is selected, the diffusion effect may be too weak and the corresponding parameter determination may not be possible. In addition to current and voltage therefore, for example, the incremental charge quantity is taken into account. In the case of effects with a pronounced current-rate dependence, such as the charge carrier throughput, a stepwise current jump should also be identified in order to be able to correctly classify the current-rate dependence of the parameters.

Figure 11:
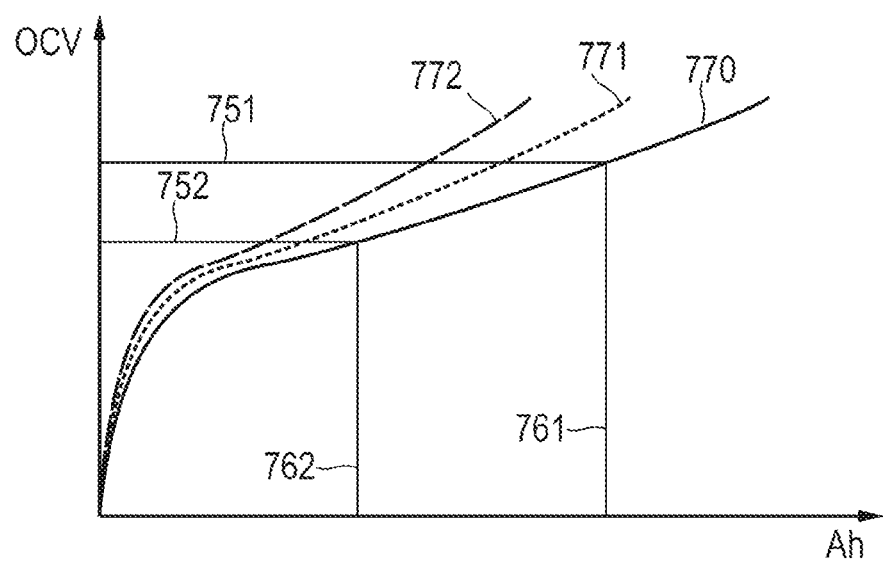
FIG. 11 schematically illustrates a standby voltage vs. charge-state characteristic curve as well as a corresponding compression according to various examples.

FIG. 11 illustrates aspects related to determining an operating value for the capacity of a battery, e.g. according to block 1022 from FIG. 9. The corresponding techniques as illustrated in relation to the example of FIG. 11, for example, can be executed on a local management system associated with a battery (for example, on the management system 61 according to FIG. 2). A result of the corresponding evaluation could then be transferred to a server 81, for example, in the form of the state data 41. This means that the operating value for the impedance can be determined on the device side at the battery. However, it would also be possible to perform the corresponding determination on the server side.

FIG. 11 shows the open-circuit voltage (OCV) as a function of the charge state (Ampere hours). The charge state correlates with the SOC. The OCV depends on the charge state via an open-circuit voltage characteristic curve. In FIG. 11, two open-circuit voltages 751, 752 are shown, as well as the associated charge states 761, 762. The charge state 761, 762 is determined taking the pre-defined characteristic curve 770 into account. For example, a lookup table can be implemented for this. From a linear interpolation of the two charge states 761, 762 (taking into account the possibly compressed characteristic curve 770-772) in conjunction with the associated charge throughput, the capacity of the battery can then be inferred.

In the various examples described here, a compression factor for the characteristic curve 770 can be determined to obtain compressed characteristic curves 771, 772. The compression factor is determined depending on an additional aging estimate for the battery, which is different from the aging estimate which is carried out thereafter on the basis of the determined capacity (i.e. the additional aging estimate is different from the aging estimate which is performed, for example, in block 1013 according to FIG. 6). The additional aging estimate and the aging estimate based on the determined capacity can be independent of each other. This is based on the recognition that the characteristic curve 770 can vary as a function of the aging state.

In general, different techniques are possible in connection with the additional aging estimate. In one example, it would be possible to monitor intercalation potentials in connection with a lithium-ion battery. Intercalation potentials represent peaks in the dV/dQ curve during the charging process of a battery, for example. They represent the transitions of the different stages of the intercalation process in the graphite anode. Their height and/or spacing is characteristic of the aging state of the battery and can therefore be used as part of the described method.

It goes without saying that the features of the embodiments and aspects of the invention described above can be combined with each other. In particular, the features can be used not only in the described combinations, but also in other combinations or in isolation, without departing from the scope of the invention.

For example, several techniques related to a battery state prediction have been described above. Such techniques can also be implemented for individual blocks of the battery or cells or cell groups of the battery.

In addition, techniques related to the characterization and/or the state prediction for a battery have been described. These results can be used to adjust the future operating profile of the battery. It would be conceivable to output such results to a user of the battery via a suitable human-machine interface. The user will then be able to select the future operating profile based on such information about the state of the battery. This corresponds to a human-machine interaction for controlling the battery.

The invention claimed is:

1. A method for server-side characterization of a rechargeable battery, which comprises:
   obtaining operating values for a capacity of the battery and an impedance of the battery,
   based on the operating values: performing at least one state prediction for the battery,
   wherein each of the at least one state predictions comprises a plurality of iterations,
   wherein in each iteration, a simulation of an electrical state of the battery and a thermal state of the battery is performed and an aging estimate for the capacity and the impedance is determined based on the results,
   wherein the aging estimate from a first iteration of the respective state prediction is used for the simulation in a subsequent second iteration of the respective state prediction.

2. The method as claimed in claim 1,
   wherein each of the at least one state predictions is associated with a corresponding operating boundary condition of the battery, wherein the at least one state prediction comprises a plurality of state predictions that are associated with different operating boundary conditions,
   the method additionally comprising:
      comparing results of the plurality of state predictions, and
      based on the comparison of the results: determining control data for a management system associated with the battery and sending the control data to the management system.

3. The method as claimed in claim 2,
   wherein the control data are indicative of one or more elements of the following group: one or more operating limits for a future operation of the battery, the operating limits being associated with one or more operating boundary conditions or an operating profile of the battery; a control parameter for a thermal management of the battery; and a control parameter for a charge management of the battery.

4. The method as claimed in claim 3,
   wherein the control data are additionally determined based on pre-defined enabled ranges for the future operation.

5. The method as claimed in claim 1,
   wherein the operating boundary conditions relate to one or more of the following elements: a control parameter of a thermal management system of the battery; and a control parameter of a charge management system of the battery.

6. The method as claimed in claim 1,
   wherein each of the at least one state predictions is associated with a corresponding operating profile of the battery.

7. The method as claimed in claim 1, additionally comprising:
   based on the simulated electrical states and/or the simulated thermal states in a plurality of iterations of the at least one state prediction: determining one or more simulated collective operating profiles for the battery, each indicating a frequency of operation of the battery at specific operating points, and
   optionally using the one or more simulated collective operating profiles for the aging estimates in the iterations.

8. The method as claimed in claim 1, additionally comprising:
   based on the simulated electrical state and/or the simulated thermal state in at least one iteration of the at least one state prediction: determining one or more simulated event-related operating profiles for the battery, and optionally using the one or more simulated event-related operating profiles for the aging estimates in the iterations.

9. The method as claimed in claim 7,
wherein the aging estimates in the iterations comprise a first component based on one or more simulated collective operating profiles,
wherein the aging estimates in the iterations comprise a second component based on the one or more simulated event-related operating profiles,
the method additionally comprising:
  combining results of the first component of the aging estimate and the second component of the aging estimate.

10. The method as claimed in claim 1,
wherein the aging estimates in the iterations use at least one of an empirical aging model and a machine-learning aging model.

11. The method as claimed in claim 1, additionally comprising:
  determining the operating value for the impedance,
  wherein determining the operating value for the impedance comprises:
    extracting values from a time series of current-voltage data of the battery for one or more jump windows,
    for each jump window: applying an analysis algorithm to the extracted values to determine a corresponding candidate value for the impedance using an equivalent electrical circuit model, and
    combining the candidate values associated with the multiple jump windows to obtain the operating value.

12. The method as claimed in claim 11, additionally comprising:
  determining the one or more jump windows based on an analysis of the time series of current-voltage data with respect to one or more criteria,
  wherein the one or more criteria are selected from: duration of a discharge operation; charge quantity of a discharge operation; rest phase before the discharge operation; duration of a charging operation; and charge quantity of a charging operation.

13. The method as claimed in claim 1, additionally comprising:
  determining the operating value for the capacity,
  wherein determining the operational value for the capacity comprises:
    determining a first open-circuit voltage in a first partially discharged state and a second open-circuit voltage in a second partially discharged state,
    determining a charge throughput between the first partially discharged state and the second partially discharged state,
    based on a pre-defined characteristic curve: determining a charge state of the battery for the first open-circuit voltage,
    based on the pre-defined characteristic curve: determining a second charge state of the battery for the first open-circuit voltage,
    determining the capacity based on the first charge state, the second charge state, and the charge throughput, and
    determining a compression factor for the characteristic curve based on a further aging estimate of the battery.

14. The method as claimed in claim 13, additionally comprising:
  performing the additional aging estimation based on monitoring of intercalation potentials of the battery.

15. The method as claimed in claim 1, additionally comprising:
  obtaining an operating profile of the battery for a monitoring interval from a management system associated with the battery,
  monitoring a development of the operating profile, and
  triggering the performing of at least one state prediction based on the monitoring of the development.

16. The method as claimed in claim 1, additionally comprising:
  obtaining an operating profile of the battery for a monitoring interval from a management system associated with the battery,
  wherein the at least one state prediction is based on the operating profile of the battery.

* * * * *